PHOTOSENSITIVE PREPOLYMER COMPOSITION AND METHOD

Filed Dec. 9, 1963

MICHAEL N. GIANGUALANO
IRVIN W. MARTENSON
INVENTORS

BY [signature]
ATTORNEY

United States Patent Office 3,376,138
Patented Apr. 2, 1968

3,376,138
PHOTOSENSITIVE PREPOLYMER COMPOSITION AND METHOD

Michael N. Giangualano, now by judicial change of name Michael Nicholas Gilano, 1718 W. Chalet Ave., Anaheim, Calif. 92804, and Irvin W. Martenson, 16615 Pequeno Place, Pacific Palisades, Calif. 90272

Filed Dec. 9, 1963, Ser. No. 328,828
19 Claims. (Cl. 96—35.1)

ABSTRACT OF THE DISCLOSURE

A photosenstive prepolymer chemical composition is disclosed for photographic relief images of particular use in the graphic arts, such as for printing plates, printed circuit boards, name plates and chemical milling; and the method of preparing and using the photoresist composition. A prepolymer of an allyl ester of an unsaturated monobasic acid or of an aliphatic carboxylic acid having two or more allyl groups is combined with a sensitizing agent which, upon absorbing actinic radiation, promotes polymerization of the prepolymer to the insoluble, infusible state.

It is well known in the art of photo-mechanical reproduction how to utilize various materials such as bichromated shellac, bichromated polyvinyl alcohol, polyvinyl cinnamate, and related unsaturated polymers to form resist images upon various subtrates or supports such as copper, copper-clad plastic sheets, aluminum, steel, brass, bronze, and other metals; and also on glass and plastics.

Bichromated shellac, bichomated polyvinyl alcohol, and bichromated polyvinyl butyral have limited shelf life, and the bichromate sensitizer must be stored in a separate container and mixed with the film-forming polymer just prior to use.

Polyvinyl cinnamate and related unsaturated ester polymers undergo film shrinkage during overexposure to actinic light, and, therefore, have certain limitations for fine-detail work.

There is a need for photosensitive compositions which are characterized by improved detail, better chemical resistance, long storage life, reproducibility from batch to batch, being preparable as a one-package system, and ease of removal after etching. There is also a need for photosensitive film compositions which do not appreciably shrink when exposed to actinic rays and which can be repeatedly washed and etched as required without adverse effects to the image detail or undercutting of the relief image.

It is an object of the present invention, therefore, to provide a novel photosensitive polymer resist.

It is another object of the present invention to provide a method for the photosensitization of prepolymers.

It is still another object of the present invention to provide a photosensitive composition which can be packaged in a single container with the required photo initiator and which has a long shelf life and exhibits unique chemical, physical, and electrical properties.

Another object of the present invention is to provide a photosensitive composition which can be easily removed by being dipped in a solvent for several minutes and rinsed off.

Another object of the present invention is to provide a stable photosensitive composition which requires no blending, heating, or chemical treatment before use, and which permits metals and other objects to be precoated and stored for long periods of time.

Another object of the present invention is to provide a superior stable light-sensitive composition which can be cross linked under the influence of actinic rays and which will form a durable coating having good heat resistance, low moisture absorption, and high resistance to acids, alkalis, and organic solvents.

According to one embodiment of the present invention, a prepolymer of an allyl ester of an unsaturated monobasic acid or a prepolymer of an allyl ester of an aliphatic carboxylic acid having two or more allyl groups is combined with an initiator or sensitizing agent and dissolved in a suitable solvent. The terms "allyl ester of an unsaturated monobasic acid" and "allyl ester of an aliphatic carboxylic acid having two or more allyl groups" are herein defined to include the copolymers of allyl esters of unsaturated monobasic acids and copolymers of the allyl esters of aliphatic carboxylic acids having two or more allyl groups.

The sensitizing agent must be one that absorbs actinic radiation so as to dissociate into free radicals which promote polymerization of the prepolymer to the insoluble, infusible state. The sensitizing agents found to be suitable are acyloin ethers such as methyl ether or benzoin and ethyl ether of benzoin; tetra alkyl diamino phenylketones such as 4,4′ bis(dimethylamino)benzophenone and 4,4′ bis(diethylamino)benzophenone; and bis 1-anthraquinonylaminoanthraquinones such as 1,4 bis(1-anthraquinonylamino)anthraquinone and 1,5 bis(1-anthraquinonylamino)anthraquinone, or combinations thereof. Other useful sensitizing agents include polynuclear quinones which are free of hydroxyl, sulfo, carboxyl, and amino groups, such as 1,2-benzanthraquinone and 2-methylanthraquinone; mononuclear quinones which are free of hydroxyl, sulfo, carboxyl, and amino groups, such as 2,5-diphenyl-p-quinone; vicinal ketaldonyl compounds such as benzil; and aryl methylene-dioxy compounds containing at least one aldehyde or keto group in which the carbon atom of the aldehyde or keto group is attached to the benzene ring. The aryl methylene-dioxy compounds must be free of sulfo, carboxyl and amino groups, such as piperonal, piperoin, 3,4-methylene dioxychalcone, and 5,6-methylene dioxyhydrindone-1. The following compounds have been found to be useful when they are free of hydroxyl, sulfo, carboxyl, and amino groups: substituted $\beta$-naphthoselenazolines such as 1-methyl-2-acetyl methylene-$\beta$-naphthoselenazoline; substituted $\beta$-benzothiazolines such as 3-methyl-2-benzoyl methylene benzothiazoline; substituted $\beta$-naphthothiazolines such as 1-methyl-2-benzoyl methylene-$\beta$-naphthothiazoline; anthrones such as anthrone; benzanthrones such as benz-2-ethylbenzanthrone and 7-H-benz(de)anthracen-7-one; and azabenzanthrones such as 2-keto-3-methyl-1,3-diazabenzanthrones.

Allyl esters containing two or more unsaturated groups, such as the mono-esters of unsaturated acids, and the allyl esters of aliphatic carboxylic acids having two or more allyl groups, can be converted to thermosetting resins which combine good solvent resistance, toughness, hardness, and excellent dimensional stability. The polymerization of these esters takes place in stages. By the term prepolymer, as used herein, is meant the soluble, fusible first stage of polymerization, which will on further crosslinking form an insoluble, infusible final polymer.

Previously, prepolymers have been carried to the final insoluble, infusible polymer stage by employing heat and pressure with a peroxide initiator. By combining a prepolymer of the present invention with a proper sensitizing agent, dissolving it in a suitable solvent, and exposing the dried film to actinic radiation, the polymerization is completed to form a thermoset, irreversible, insoluble, infusible solid.

Examples of prepolymers found to be useful include:

(a) Allyl esters of unsaturated monobasic acids having either the general formula $C_nH_{2n-1}COOR$ or $$C_nH_{2n-1-y}X_yCOOR$$

such as allyl acrylate, allyl chloroacrylate, allyl methacrylate, allyl crotonate, ay cinnamate, alyl cinnamalacetate, allyl furoate, and allyl furfurylacrylate. It is to be understood that in all formulas used herein, R is an allyl group, *n* can be any integer from 1 to 17, inclusive, except where the carboxylic acid is unsaturated, in which case *n* can be an integer from 1–17, inclusive, y is 1 to 2, and X is a halogen, hydroxyl, phenyl, substituted phenyl, or furfuryl group or an alkyl or alkoxy group having 1–4 carbon atoms.

(b) Copolymers of allyl esters of unsaturated monobasic acids; such as allyl methacrylate with butadiene, allyl methacrylate with methyl methacrylate, allyl methacrylate with styrene, allyl methacrylate with vinylidene chloride, allyl crotonate with methyl methacrylate, allyl crotonate with styrene, allyl crotonate with vinyl chloride, allyl crotonate with vinyl acetate, allyl crotonate with vinylidene chloride, allyl crotonate with diethyleneglycol maleate, allyl cinnamate with vinylidene chloride, allyl cinnamate with styrene, allyl cinnamate with cinnamyl cinnamate, allyl furoate with styrene, allyl furoate with vinylidene chloride.

(c) Allyl esters of aliphatic carboxylic acids having two or more allyl groups and having one of the following general formulas: $C_nH_{2n}(COOR)_2$, $C_nH_{2n-1}(COOR)_3$, $$C_nH_{2n-y}X_y(COOR)_2,\ C_nH_{2n-1-y}X_y(COOR)_3$$

$C_nH_{2n-2}(COOR)_2$, $C_nH_{2n-2-y}X_y(COOR)_2$, or ROOCOR, such as diallyl oxalate, diallyl malonate, diallyl succinate, diallyl sebacate, diallyl maleate, diallyl fumerate, diallyl itaconate, diallyl tartrate, diallyl carbonate, diallyl adipate, triallyl citrate, triallyl carballylate, diallyl malate, and diallyl citraconate.

(d) Copolymers of allyl esters of aliphatic carboxylic acids having two or more allyl groups; such as diallyl oxalate with vinylidene chloride, diallyl oxalate with styrene, diallyl malonate with vinylidene chloride, diallyl succinate with vinylacetate, diallyl succinate with vinylidene chloride, diallyl succinate with polyvinyl acetate, diallyl adipate with vinylidene chloride, diallyl sebacate with vinylidene chloride, diallyl maleate with methyl methacrylate, diallyl maleate with styrene, diallyl maleate with vinylidene chloride, and diallyl varbonate with methyl methacrylate.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
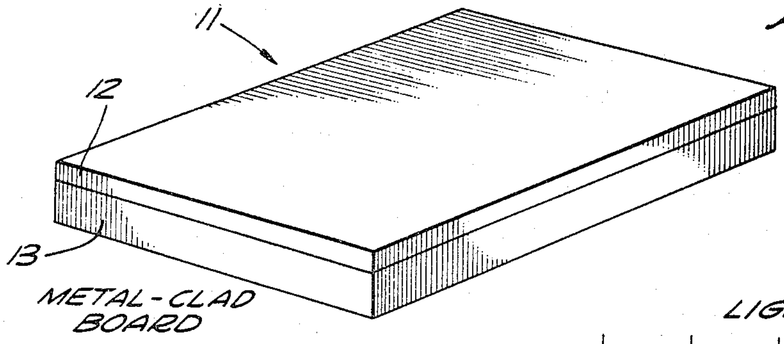
FIGURE 1 is an isometric view of a laminated metal-clad board.

The prepolymers of the allyl esters of unsaturated monobasic acids and the allyl esters of aliphatic carboxylic acids having two or more allyl groups can be prepared by controlled partial polymerization of the monomeric allyl ester. For example, the diallyl malonate liquid monomer is converted to the prepolymer by heating the liquid diallyl malonate in a suitable solvent in the presence of a peroxide catalyst, and by not allowing the polymerization to proceed to completion.

The polymerization should be stopped when practically all the change is specific gravity has taken place, preferably to an iodine number of 56 to 64. The reaction is stopped at this point by cooling and the addition of an inhibitor.

The prepolymer is then recovered from the solvent and is washed and dried. A white powder is obtained which when dissolved in a suitable solvent, such as a ketone, yields a water-white solution.

The photosensitive resin composition can be a solid mixture of materials, as in a dried coating, or a solution of the materials in a suitable organic solvent or mixture of solvents. Good solvents for the sensitized allyl prepolymers include:

(1) Esters such as isobutyl acetate, butyl "carbitol" acetate, amyl acetate, butyl "cellosolve" acetate, ethyl acetate, and methyl "cellosolve" acetate.

(2) Ketones such as acetophenone, diacetone alcohol, diisobutyl ketone, methyl isobutyl ketone, and isophorone.

(3) Glycol ethers such as ethylene glycol methyl ether, diethylene glycol methyl ether, and propylene glycol methyl ether.

(4) Chlorinated solvents such as 1,1,1-trichlorethane, trichlorethylene, and methylene chloride.

The described prepolymer resin has the rare characteristic that its polymerization can be stopped at a determined point and it can be precipitated as a solid and stored at ambient temperatures, and if desired, subsequently converted into an infusible solid by employing peroxides and heat and pressure, or in accordance with this invention, by means of actinic radiation.

The resultant diallyl malonate prepolymer exhibits film forming properties, excellent chemical resistance to both acids and alkalis, excellent moisture resistance, and shows very little shrinkage when further cross-linked with actinic light. As a result of these properties, it is an ideal material for use as a resist in the manufacture of printed circuit boards, semiconductor parts, micro-chemical millin, and for preparing presensitized printing plates. The solution of allyl prepolymer and solvent when dried forms a non-tacky film, suitable for intimate contact with photographic masks while being exposed. The mask does not stick to the dried coating.

The light-sensitive polymeric composition, by being pre-shrunk before use, makes it possible to obtain accurate dimensional detail in printed circuits, chemical milling, etc., since a minimum shrinkage will occur during the further cross-linking of the allyl ester prepolymer when it is exposed to actinic rays. This is because of the fact that the allyl ester prepolymers have been previously processed to the point where practically all of the change in specific gravity has taken place, thereby assuring that very little shrinkage will occur during exposure to actinic radiation. This means that for fine detail work, the shrinkage does not have to be compensated for in the photographic negative.

Another advantage is the fact that the prepolymer can be dissolved in a suitable organic solvent along with the sensitizers considerably in advance of exposure, and will exhibit exceptional stability and long shelf life.

The allyl ester prepolymers of unsaturated monobasic acids and the allyl ester prepolymers of aliphatic polycarboxylic acids having two or more allyl groups tend to progress or further cross-link when stored in the dried state for several months at ambient room temperature. This progression changes the prepolymer solubility characteristics by increasing the prepolymer viscosity in a solvent, such as methyl isoamyl ketone, to the point of insolubility. For example, a freshly prepared prepolymer of diallyl malonate with an iodine number of 56 to 64 is soluble in xylene. When stored in the dry state at ambient room temperature in the absence of air there is no noticeable change in the solubility up to six months. However, if the prepolymer is exposed to air and the temperature is held above 85 degrees F., the prepolymer will progress to the point where it is neither soluble in methyl isoamyl ketone nor in a stronger solvent such as methyl ethyl ketone.

If the freshly prepared prepolymer is first dissolved in methyl isoamyl ketone, xylene, or any suitable solvent, together with the sensitizer, the progression of the prepolymer is retarded, resulting in a very long shelf life.

The concentration of sensitizer in the photo resist composition depends upon the amount of the allyl prepolymer present. In the case of the prepolymer of diallyl malonate, from about 1 to 20%, preferably 1.5 percent by weight of 3-methyl-2 benzoyl methylene benzothiazoline can be used. Some sensitizers such as p,p′ substituted benzophenones, e.g., 4,4′-bis(dimethylamino)benzophenone, in an amount less than 1.5%, cause a considerable increase in sensitivity to actinic light. The sensitizer is excited by the actinic radiation, and, in turn, speeds up the polymerization. This is accomplished by the sensitizer being dissociated into free radicals by the actinic radiation or energy that it absorbs. The free radicals initiate the polymerization of the prepolymer.

The present invention will be more readily understood from a consideration of the following specific examples, which are given for the purpose of illustration only, and are not intended to limit the scope of the invention in any way:

Example I

A typical resist formulation useful for making relief images on copper plates or printing plates is prepared as follows:

| | Grams |
|---|---|
| Allyl methacrylate prepolymer | 1.5 |
| Methyl isobutyl ketone | 2.5 |
| Cellosolve acetate | 2.5 |
| Benzil | .05 |
| 4,4′ bis(dimethylamino)benzophenone | .01 |

The materials are mixed together employing slight heat until all parts are dissolved. The solution is then filtered, after which it is ready for use. For this photosensitive resist composition it is preferred to use methyl cellosolve acetate as a developer, although ketones such as methyl ethyl ketone, or chlorinated solvents such as Trichlorethylene can be used.

Example II 2.4 grams of a prepolymer of a copolymer of a monoallyl ester of an unsaturated acid, such as allyl methacrylate with styrene, is dissolved in a mixture of 5.0 grams of methyl isobutyl ketone and 5.0 grams of cellosolve acetate with slight heat and agitation. Then .48 gram of methyl ether of benzoin is added directly to the solvent resin solution and mixed until dissolved. After filtering, the composition is ready for use.

Example III 1.5 grams diallyl succinate prepolymer
5.0 grams methyl isoamyl ketone
.04 gram piperonal
.02 gram 4,4 bis(dimethylamino)benzophenone

Example IV 1.5 grams diallyl maleate prepolymer
5.0 grams methyl isoamyl ketone
.02 gram 4,4 bis(dimethylamino)benzophenone

Example V 1.5 grams prepolymer of a copolymer of diallyl maleate with methyl methacrylate
5.0 grams cellosolve acetate
.02 gram 4,4 bis(dimethylamino)benzophenone

Example VI 1.5 grams prepolymer of a copolymer of allyl cinnamate with styrene
2.0 grams methyl isobutyl ketone
2.0 grams xylene
1.0 gram cellosolve acetate
.05 gram 2-keto-3-methyl-1,3-diazabenzanthrone The method of preparing a support plate with a photopolymerizable coating composition includes the following steps; the photosensitive material is applied to the support plate by dipping, spraying, roller coating, or other conventional means. The wet coated plate is commonly drained or whirled to obtain a uniform film thickness. After drying at room or slightly elevated temperature in subdued light, the plate is placed in intimate contact with a photographic negative and exposed to actinic light. Useful light sources are mercury vapor lamps or high intensity photo carbon arcs. Exposure times vary from a fraction of a minute to several minutes at a distance of 2 to 3 feet, respectively. The actinic light quickly polymerizes the dried coating, rendering it insoluble in selected organic solvents. The exposed plate is then developed by immersion in an organic solvent such as xylene or 1,1,1-trichlorethane for less than a minute at room temperature. By immersion, the organic solvent dissolves the unexposed areas of the coating and allows the exposed areas to remain intact on the support plate. The transparent image on the photographic negative is thus accurately reproduced as a resist image on the support plate.

After development, an optional step is to dye the resist image, which is normally transparent and colorless and difficult to see, by immersion for less than a minute in a dye bath comprising a synthetic dye in a compatible organic solvent. Finally, the plate is washed in flowing water and dried.

If etching of the metal base areas not protected by the resist image is desired, the plate is immersed in a suitable acid or alkali. Ferric chloride and ammonium persulfate are common etchants for copper; sodium hydroxide is used for aluminum, as is also electrolytic etching in dilute hydrochloric acid. In other processes the resist image serves as an intermediate step for electroplating and evaporative-film operations, or as an opaque film for images on transparent objects as signs, or to produce decorative effects. In photo milling, which is a relatively new method for making small accurate metal parts of thin metal sheet, the resist image is applied to both sides of the sheet in accurate register. The metal etchant is then applied to both sides to remove unwanted metal.

Turning now to the drawings, which illustrate the use of the described photosensitive resist composition in a process for making printed circuit boards, FIGURE 1 shows a board 11 having a covering layer 12 of 0.0014 inch thick copper sheet laminated to a 0.060 inch thick phenolic composition base 13, such as is commonly used in the printed-circuit industry. Board 11 should be scrubbed with an abrasive cleaner and dried.

Figure 2:
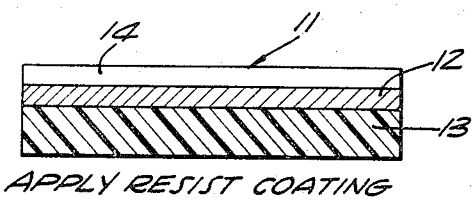
FIGURES 2–6 are sectional views taken through the board of FIGURE 1, and showing successive steps in the use of the photosensitive resist composition according to the present invention.

FIGURE 2 is a sectional view showing board 11 after the described photosensitive resist composition is applied as by flowing onto the surface of copper layer 12 to form layer 14. The excess resist can be drained by holding the board vertically for several minutes. The coating is then dried by placing board 11 in an oven maintained at approximately 125° F. for 10 minutes. The coating, when removed from the oven, is smooth, glossy, and hard.

Figure 3:
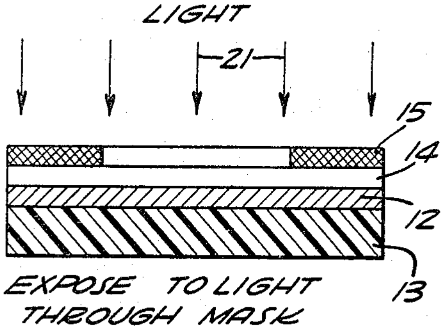

FIGURE 3 shows how mask 15, which can be a photographic negative of an electrical circuit, is placed in contact with the photosensitive layer 14. The combination is then put into the vacuum frame of a printing machine and exposed for one to three minutes to a high-intensity photocarbon arc light source about 2 feet away, represented by arrows 21. Light of from 3200–4000 angstrom units is very satisfactory. After exposure, the board is removed and the coating developed by placing the board vertically in a tank of methyl ethyl ketone for approximately 30 seconds. The board is then removed and immersed for 30 seconds in a second tank containing a solution of dye in organic solvent to render the normally-transparent resist image visible.

Figure 4:
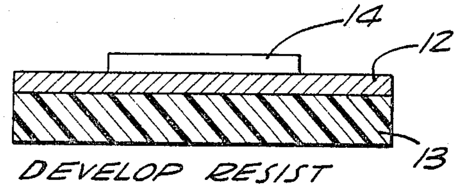

FIGURE 4 shows the board after it is rinsed in flowing water to remove adhering dissolved resist solution and excess dye and finally dried by slightly warming it.

The board at this stage is ready for etching and has on the copper surface the image of the electrical circuit, this image being comprised of a film of dry, hard, polymerized resist. The surface area other than that covered by the resist image is bare copper.

Figure 5:
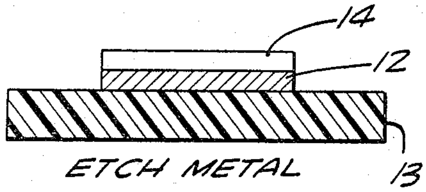

FIGURE 5 shows the board after the bare copper is removed by a suitable acid-type etchant. The board can be placed in a spray-type etching machine, of a kind commonly used in the industry, which sprays a solution of ferric chloride on the surface. The concentration of the ferric chloride, commonly stated in terms of specific gravity, can be 38 degrees Baumé. Within several minutes the bare unprotected copper on the board surface will be completely etched away. The board is then removed and thoroughly rinsed to remove all traces of ferric chloride, and then dried.

Figure 6:
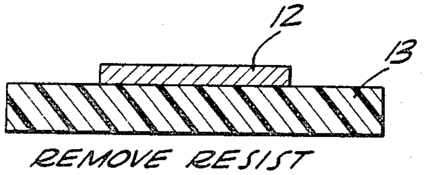

FIGURE 6 shows the board after it is immersed in a solvent such as trichlorethylene or methyl ethyl ketone to soften the resist image, which can be removed by scrubbing with a mild abrasive cleaner, revealing the bright-copper electrical circuit. The finished circuit board can be rinsed in hot water and dried.

There has thus been described how certain polymeric material compositions and elements embodying prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, and certain sensitizers which increase the light sensitivity of this class of compounds can be used in the manufacture of printed circuit boards.

The described photoresist composition is also very useful in the manufacture of offset printing plates, and provides many advantages over presently available diazo-sensitized plates, which are sensitive to the humidity in the air and require a sub-coating on the metal substrate to prevent the metal from reacting with the diazo material and curing it, which would destroy its usefulness in printing. In addition, diazo materials have shorter printing runs, and after developing require a treatment involving the application of a suitable coating to achieve longer runs.

The photoresist composition of the prevent invention is not affected by metal substrates, even those made of aluminum. Thus, no sub-coating is necessary for use in the manufacture of printing plates. In addition, extremely long printing runs are made possible without the necessity of special treatment after developing.

For use in the manufacture of printing plates, after the degreased metal sheet is coated with the photoresist composition of the present invention, it is dried, exposed to actinic radiation with a suitable mask or negative, developed by immersion in a suitable solvent, rinsed in water and dried. Then, a dilute solution of phosphoric acid is applied with a cloth over the surface to render the exposed aluminum surface water receptive. The photoresist protects the metal covered by it from the phosphoric acid.

During printing, the exposed aluminum picks up water, while the photoresist of the present invention, which is very ink receptive because of its nonpolarity, picks up the ink. The strong adhesion of the photoresist to the metal substrate and the high abrasion resistance of the photoresist results in long runs.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

We claim:

1. A method comprising the steps of:

(a) applying to a metal surface a composition consisting essentially of allyl ester selected from the group consisting of allyl esters of unsaturated monobasic acids, copolymers of allyl esters of unsaturated monobasic acids, allyl esters of aliphatic carboxylic acids having two or more or allyl groups, and copolymers of allyl esters of aliphatic carboxylic acids having two or more allyl groups; and which has been polymerized to partial completion until it has become a prepolymer which is a solid at ambient temperature and which has been recovered from the reaction mixture produced by the polymerization of said allyl ester to partial completion, and undergoes very little shrinkage when further cross-linked by actinic radiation, said allyl ester having a general formula selected from the group consisting of $$C_nH_{2n-1}COOR$$
$$C_nH_{2-n1-y}X_yCOOR$$
$$C_nH_{2n}(COOR)_2$$
$$C_nH_{2n-1}(COOR)_3$$
$$C_nH_{2n-y}X_y(COOR)_2$$
$$C_nH_{2n-1-y}X_y(COOR)_3$$
$$C_nH_{2n-2}(COOR)_2$$

$C_nH_{2n-2-y}X_y(COOR)_2$, and ROOCOR, where R is an allyl group, $n$ is any integer from 1 to 17 except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizing agent which, upon absorbing actinic radiation, can accelerate complete polymerization of said allyl ester, (b) placing a mask in cooperative relationship with respect to said composition, (c) exposing said mask to actinic radiation, (d) removing said mask, and (e) removing the unexposed portions of said composition from said surface.

2. A method comprising the steps of:

(a) applying to a metal surface a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being capable of polymerizing to completion by photoinitiated polymerization in the presence of a sensitizing agent which is activatable by actinic radiation, said prepolymer being a solvent-soluble material which is a solid at ambient temperature, has been precipitated from the reaction mixture produced by polymerization of the allyl ester from which said prepolymer has been prepared, and undergoes very little shrinkage when further cross-linked by actinic radiation, said allyl esters having a general formula selected from the group consisting of $C_nH_{2n-1}COOR$, $C_nH_{2n-1-y}X_yCOOR$, $$C_nH_{2n}(COOR)_2$$
$$C_nH_{2n-1}(COOR)_3$$
$$C_nH_{2n-y}X_y(COOR)_2$$
$$C_nH_{2n-1-y}X_y(COOR)_3$$
$$C_nH_{2n-2}(COOR)_2$$

$C_nH_{2n-2-y}X_y(COOR)_2$, and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having from 1 to 4 carbon atoms, and alkoxy having 1 to 4 carbon atoms; and a photopolymerization sensitizer selected from the group consisting of acyloin ethers, tetra alkyl diamino phenylketones, bis 1-anthraquinonyl amino anthraquinones, polynuclear quinones, mononuclear quinones, vicinal ketaldonyl compounds, aryl methylenedioxy compounds, substituted β-naphthoselenazolines, substituted β-benzothiazolines, substituted β-naphthothiazolines, anthrones, benzanthrones, and azabenzanthrones; said polynuclear quinones, mononuclear quinones, substituted β-naphthoselenazolines, substituted β-benzothiazolines, substituted β-naphthothiazolines, anthrones, benzanthrones, and azabenzanthrones being free of hydroxyl, sulfo, carboxyl, and amino groups; and said aryl methylenedioxy compounds being free of sulfo, carboxyl and amino groups and containing at least one group selected from the group consisting of aldehyde and keto groups in which the carbon atom of the group is attached to the benzene ring, (b) placing a mask in cooperative relationship with respect to said composition, (c) exposing said mask to actinic radiation, (d) removing said mask, and (e) removing the unexposed portions of said composition from said surface.

3. A photosensitive resist composition consisting essentially of:

(a) a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, said allyl esters having a general formula selected from the group consisting of $$C_nH_{2n-1}COOR$$
$$C_nH_{2-n1-y}X_yCOOR$$
$$C_nH_{2n}(COOR)_2$$
$$C_nH_{2n-1}(COOR)_3$$
$$C_nH_{2n-y}X_y(COOR)_2$$
$$C_nH_{2n-1-y}X_y(COOR)_3$$
$$C_nH_{2n-2}(COOR)_2$$

$C_nH_{2n-2-y}X_y(COOR)_2$, and ROOCOR, where R is an allyl group, $n$ is any integer from 1 to 17 except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms, and (b) a photopolymerization sensitizing agent which, upon absorbing actinic radiation, can dissociate into free radicals which accelerate complete polymerization of said prepolymer.

4. A photosensitive resist composition consisting essentially of:

(a) a prepolmyer selected from the group consisting of prepolymers of allyl esters of unsaturated monoacids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, and which has been recovered from the reaction mixture produced by the polymerization of the allyl ester from which said prepolymer has been prepared, said allyl esters having a general formula selected from the group consisting of $C_nH_{2n-1}COOR$, $$C_nH_{2-n1-y}X_yCOOR$$
$$C_nH_{2n}(COOR)_2$$
$$C_nH_{2n-1}(COOR)_3$$
$$C_nH_{2n-y}X_y(COOR)_2$$
$$C_nH_{2n-1-y}X_y(COOR)_3$$
$$C_nH_{2n-2}(COOR)_2$$

$C_nH_{2n-2-y}X_y(COOR)_2$, and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms, and (b) a photopolymerization sensitizer selected from the group consisting of acyloin ethers, tetra alkyl diamino phenylketones, bis 1-anthraquinonyl amino anthraquinones, polynuclear quinones, mononuclear quinones, vicinal ketaldonyl compounds, aryl methylene-dioxy compounds, substituted β-naphthoselenazolines substituted β-benzothiazolines, substituted β-naphthothiazolines, anthrones, benzanthrones, and azabenzanthrones; said polynuclear quinones, mononuclear quinones, substituted β-naphthoselenazolines, substituted β-benzothiazolines, substituted β-naphthothiazolines, anthrones, benzanthrones, and azabenzanthrones being free of hydroxyl, sulfo, carboxyl, and amino groups; and said acyl methylenedioxy compounds being free of sulfo, carboxyl and amino groups and containing at least one group selected from the group consisting of aldehyde and keto groups in which the carbon atoms of the group is attached to the benzene ring.

5. A photosensitive resist composition consisting essentially of:

(a) a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, and which has been recovered from the reaction mixture produced by the polymerization of the allyl ester from which said prepolymer has been prepared, said allyl esters having a general formula selected from the group consting of $$C_nH_{2n-1}COOR$$
$$C_nH_{2n-1-y}X_yCOOR$$
$$C_nH_{2n}(COOR)_2$$
$$C_nH_{2n-1}(COOR)_3$$
$$C_nH_{2n-y}X_y(COOR)_2$$
$$C_nH_{2n-1-y}X_y(COOR)_3$$
$$C_nH_{2n-2}(COOR)_2$$

$C_nH_{2n-2-y}X_y(COOR)_2$, and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms, and (b) a photopolymerization sensitizer selected from the group consisting of methyl ether of benzoin, ethyl ether of benzoin, 4,4′ bis(dimethylamino)benzophenone, 4,4′ bis(diethylamino)benzophenone, 1,4 bis(1-anthraquinonylamino)anthraquinone, 1,5 bis-(1 - anthraquinonylamino)anthraquinone, 1,2-benz-anthraquinone, 2-methylanthraquinone, 2,5-diphenyl-p-quinone, benzil, piperonal, 3,4-methylene dioxychalcon, 5,6 - methylene dioxyhydrindone-1, piperoin, 1 - methyl-2-acetyl methylene-β-naphthoselenazoline, 3-methyl-2-benzoyl methylene benzothiazoline, 1 - methyl-2-benzoyl methylene-β-naphthothiazoline, anthrone, benz-2-ethylbenzanthrone, 7-H-benz(de)-anthracen-7-one, and 2-keto-3-methyl-1,3-diazobenzanthrone.

6. A photosensitive resist composition consisting essentially of:

(a) a prepolymer selected from the group consisting of allyl acrylate, allyl chloroacetate, allyl methacrylate, allyl crotonate, allyl cinnamate, allyl cinnamalacetate, allyl furoate, allyl fufurylacrylate, a copolymer of allyl methacrylate with butadiene, a copolymer of allyl methacrylate with methyl methacrylate, a copolymer of allyl methacrylate with styrene, a copolymer of allyl methacrylate with vinylidene chloride, a copolymer of allyl crotonate with methyl methacrylate, a copolymer of allyl crotonate with styrene, a copolymer of allyl crotonate with vinyl chloride, a copolymer of allyl crotonate with vinyl acetate, a copolymer of allyl crotonate with vinylidene chloride, a copolymer of allyl crotonate with diethyleneglycol maleate, a copolymer of allyl cinnamate with vinylidene chloride, a copolymer of allyl cinnamate with styrene, a copolymer of allyl cinnamate with cinnamyl cinnamate, a copolymer of allyl furoate with styrene, a copolymer of allyl furoate with vinylidene chloride, diallyl oxalate, diallyl malonate, diallyl succinate, diallyl sebacate, diallyl maleate, diallyl fumerate, diallyl itaconate, diallyl tratrate, diallyl carbonate, diallyl adipate, triallyl citrate, triallyl carballylate, diallyl malate, diallyl citraconate, a copolymer of diallyl oxalate with vinylidene chloride, a copolymer of diallyl oxalate with styrene, a copolymer of diallyl malonate with vinylidene chloride, a copolymer of diallyl succinate with vinylacetate, a copolymer of diallyl succinate with vinylidene chloride, a copolymer of diallyl succinate with polyvinyl acetate, a copolymer of diallyl adipate with vinylidene chloride, a copolymer of dialyl sebacate with vinylidene chloride, a copolymer of diallyl maleate with methyl methacrylate, a copolymer of diallyl maleate with styrene, a copolymer of diallyl maleate with vinylidene chloride, and a copolymer of diallyl carbonate with methyl methacrylate; and which has been polymerized to partial completion, said prepolymer being a solvent-soluble material which is a solid at ambient temperature and undergoes a very little shrinkage when further cross-linked by actinic radiation, and which has been precipitated from the reaction mixture produced by the polymerization of the allyl ester from which said prepolymer has been prepared, and (b) a photopolymerization sensitizing agent selected from the group consisting of methyl ether of benzoin, ethyl ether of benzoin, 4,4′ bis(dimethylamino)benzophenone, 4,4′ bis(diethylamino)benzophenone, 1,4 bis(1-anthraquinoylamino)anthraquinone, 1.5 bis(1-anthraquinoylamino)anthraquinone, 1,2-benzanthraquinone, 2-methylanthraquinone, 2,5-diphenyl-p-quinone, benzil, piperonal, 3,4-methylene dioxychalcone, 5,6 - methylene dioxyhydrindone-1, piperoin, 1-methyl-2-acetyl methylene - β-naphthoselenazoline, 3-methyl-2-benzoyl methylene benzothiazoline, 1 - methyl-2-benzoyl methylene-β-naphthothiazoline, anthrone, benz - 2-ethylbenzanthrone, 7-H-bez(H),anthracen-7-one, and 2-keto-3-methyl-1,3-diazabenzanthrone.

7. A method of making a printed-circuit board, comprising the steps of:

(a) applying to a surface a composition consisting essentially of an allyl ester selected from the group consisting of allyl esters of unsaturated monobasic acids, copolymers of allyl esters of unsaturated monobasic acids, allyl esters of aliphatic carboxylic acids having two or more allyl groups, and copolymers of allyl esters of aliphatic carboxylic acids having two or more allyl groups; and which has been polymerized to partial completion until practically the entire change in specific gravity has taken place and it becomes a prepolymer which is a solid at ambient temperature and which has been recovered from the reaction mixture produced by the polymerization of said allyl ester to partial completion, and undergoes very little shrinkage when further cross-linked by actinic radiation; and a photopolymerization sensitizing agent which, upon absorbing actinic radiation, can accelerate complete polymerization of said allyl ester, (b) placing a mask in cooperative relationship with respect to said composition, (c) exposing said mask to actinic radiation, (d) removing said mask, and (e) removing the unexposed portions of said composition from said surface.

8. A method of making a printed-circuit board, comprising the steps of:

(a) applying to the surface of a metal-clad printed-circuit board a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being capable of polymerizing to completion by photo-initiated polymerization in the presence of a sensitizing agent which is activatable by actinic radiation, said prepolymer being a solvent-soluble material which is a solid at ambient temperature, has been recovered from the reaction mixture produced by polymerization of the allyl ester from which said prepolymer has been prepared, and undergoes very little shrinkage when further cross-linked by actinic radiation, said allyl esters having a general formula selected from the group consisting of $C_nH_{2n-1}COOR$, $$C_nH_{2n-1-y}X_yCOOR,\ C_nH_{2n}(COOR)_2$$
$$C_nH_{2n-1}(COOR)_3,\ C_nH_{2n-y}X_y(COOR)_2$$
$$C_nH_{2n-1-y}X_y(COOR)_3,\ C_nH_{2n-2}(COOR)_2$$

$C_nH_{2n-2-y}X_y(COOR)_2$, and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizing agent which, upon absorbing actinic radiation, can accelerate polymerization of said prepolymer, (b) placing a mask in cooperative relationship with respect to said composition, (c) exposing said mask to actinic radiation, (d) removing said mask, (e) removing the unexposed portions of said composition from said surface, (f) etching away the exposed portions of said metal surface, and (g) removing the remaining portion of said composition from said board.

9. A method of making a printed-circuit board, comprising the steps of:

(a) applying to the surface of a metal-clad printed-circuit board a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being capable of polymerizing to completion by photoinitiated polymerization in the presence of a sensitizing agent which is activatable by actinic radiation, said prepolymer being a solvent-soluble material which is a solid at ambient temperature, has been recovered from the reaction mixture produced by polymerization of the allyl ester from which said prepolymer has been prepared, and undergoes very little shrinkage when further cross-linked by actinic radiation, said allyl esters having a general formula selected from the group consisting of $C_nH_{2n-1}COOR$, $$C_nH_{2n-1-y}X_yCOOR,\ C_nH_{2n}(COOR)_2$$
$$C_nH_{2n-1}(COOR)_3,\ C_nH_{2n-y}X_y(COOR)_2$$
$$C_nH_{2n-1-y}X_y(COOR)_3,\ C_nH_{2n-2}(COOR)_2$$

$C_nH_{2n-2-y}X_y(COOR)_2$, and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizer selected from the group consisting of acyloin ethers, tetra alkyl diamino phenylketones, bis 1-anthraquinonyl amino anthraquinones, polynuclear quinones, mononuclear quinones, vicinal ketaldonyl compounds, aryl methylene-dioxy compounds, substituted β-naphthoselenazolines, substituted β-benzothiazolines, substituted β-naphthothiazolines, anthrones, benzanthrones, and azabenzanthrones; said polynuclear quinones, mononuclear quinones, substituted β-naphthoselenazolines, substituted β-benzothiazolines, substituted β-naphthothiazolines, anthrones, benzanthrones, and azabenzanthrones being free of hydroxyl, sulfo, carboxyl, and amino groups; and said aryl methylene-dioxy compounds being free of sulfo, carboxyl and amino groups and containing at least one group selected from the group consisting of aldehyde and keto groups in which the carbon atom of the group is attached to the benzene ring, (b) placing a mask in cooperative relationship with respect to said composition, (c) exposing said mask to actinic radiation, (d) removing said mask, (e) removing the unexposed portions of said composition from said surface, (f) etching away the exposed portions of said metal surface, and (g) removing the remaining portion of said composition from said board.

10. A method of making a printed-circuit board, comprising the steps of:

(a) applying to the metal surface of a metal-clad printed-circuit board a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being capable of polymerizing to completion by photoinitiated polymerization in the presence of a sensitizing agent which is activatable by actinic radiation, said prepolymer being a solvent-soluble material which is a solid at ambient temperature, has been recovered from the reaction mixture produced by polymerization of the allyl ester from which said prepolymer has been prepared, and undergoes very little shrinkage when further cross-linked by actinic radiation, said allyl esters having a general formula selected from the group consisting of $C_nH_{2n-1}COOR$, $$C_nH_{2n-1-y}X_yCOOR,\ C_nH_{2n}(COOR)_2$$
$$C_nH_{2n-1}(COOR)_3,\ C_nH_{2n-y}X_y(COOR)_2$$
$$C_nH_{2n-1-y}X_y(COOR)_3,\ C_nH_{2n-2}(COOR)_2$$

$C_nH_{2n-2-y}X_y(COOR)_2$, and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizing agent selected from the group consisting of methyl ether of benzoin, ethyl ether of benzoin, 4,4′ bis(dimethylamino) benzophenone, 4,4′ bis(diethylamino)benzophenone, 1,4 bis(1-anthraquinoylamino)anthraquinone, 1,5 bis (1-anthraquinoylamino)anthraquinone, 1,2-benzanthraquinone, 2-methyl-anthraquinone, 2,5-diphenyl-p-quinone, benzil, piperonal, 3,4-methylene dioxychalcone, 5,6-methylene dioxyhydrindone-1, piperoin, 1-methyl-2-acetyl methylene-β-naphthoselenazoline, 3-methyl-2-benzoylmethylene benzothiazoline, 1-methyl-2-benzoyl methylene-β-naphthothiazoline, anthrone, benz-2-ethylbenzanthrone, 7-H-benz(de)-anthracen-7-one, and 2-keto-3-methyl-1,3-diazabenzanthrone, (b) placing a mask in cooperative relationship with respect to said composition, (c) exposing said mask to actinic radiation, (d) removing said mask, (e) removing the unexposed portions of said composition from said surface, (f) etching away the exposed portions of said metal surface, and (g) removing the remaining portion of said composition from said board.

11. A method of making a printed-circuit board, comprising the steps of:

(a) applying to the metal surface of a metal-clad printed circuit board a composition consisting essentially of a prepolymer selected from the group consisting of allyl acrylate, allyl chloroacrylate, allyl methacrylate, allyl crotonate, allyl cinnamate, allyl cinnamalacetate, allyl furoate, allyl furfurylacrylate, a copolymer of allyl methacrylate with butadiene, a copolymer of allyl methacrylate with methyl methacrylate, a copolymer of allyl methacrylate with styrene, a copolymer of allyl methacrylate with vinylidene chloride, a copolymer of allyl crotonate with methyl methacrylate, a copolymer of allyl crotonate with styrene, a copolymer of allyl crotonate with vinyl chloride, a copolymer of allyl crotonate with vinyl acetate, a copolymer of allyl crotonate with vinylidene chloride, a copolymer of allyl crotonate with diethyleneglycol maleate, a copolymer of allyl cinnamate with vinlidene chloride, a copolymer of allyl cinnamate with styrene, a copolymer of allyl cinnamate with cinnamyl cinnamate, a copolymer of allyl furoate with styrene, a copolymer of allyl furoate with vinylidene chloride, diallyl oxalate, diallyl malonate, diallyl succinate, diallyl sebacate, diallyl maleate, diallyl fumerate, diallyl itaconate, diallyl tartrate, diallyl carbonate, diallyl adipate, triallyl citrate, triallyl carballylate, diallyl malate, diallyl citraconate, a copoymer of diallyl oxalate with vinylidene chloride, a copolymer of diallyl oxalate with styrene, a copolymer of diallyl malonate with vinylidene chloride, a copolymer of diallyl succinate with vinylacetate, a copolymer of diallyl succinate with vinylidene chloride, a copolymer of diallyl succinate with polyvinyl acetate, a copolymer of diallyl adipate with vinylidene chloride, a copolymer of diallyl sebacate with vinylidene chloride, a copolymer of diallyl maleate with methyl methacrylate, a copolymer of diallyl maleate with styrene, a copolymer of diallyl maleate with vinylidene chloride, and a copolymer of diallyl carbonate with methyl methacrylate, said prepolymer being capable of polymerizing to completion by photoinitiated polymerization in the presence of a sensitizing agent which is activatable by actinic radiation, said prepolymer being a solvent-soluble material which is a solid at ambient temperature, has been precipitated from the reaction mixture produced by polymerization of the allyl ester from which said prepolymer has been prepared, and undergoes very little shrinkage when further cross-lined by actinic radiation; and a photopolymerization sensitizing agent selected from the group consisting of methyl ether of benzoin, ethyl ether of benzoin, 4,4′ bis(dimethylamino)benzophenone, 4,4′ bis(diethylamino)benzophenone, 1,4 bis(1-anthraquinoylamino)anthraquinone, 1,5 bis(1-anthraquinoylamino)anthraquinone, 1,2-benzanthraquinone, 2 - methyl-anthraquinone, 2,5-diphenyl-p-quinone, benzil, piperonal, 3,4-methylene dioxychalcone, 5,6-methylene dioxyhydrindone-1, piperoin, 1-methyl-2-acetyl methylene-β-naphthoselenazoline, 3-methyl - 2 - benzoyl methylene benzothiazoline, 1-methyl - 2 - benzoyl methylene-β-naphthothiazoline, anthrone, benz-2-ethylbenzanthrone, 7-H-benz(de)-anthracen-7-one, and 2-keto-3-methyl-1,3-diazabenzanthrone, (b) placing a mask in contact with said composition,
(c) exposing said mask to actinic radiation,
(d) removing said mask,
(e) removing the unexposed portions of said composition from said surface,
(f) etching away the exposed portions of said metal surface, and
(g) removing the remaining portion of said composition from said board.

12. A method of making a printed-circuit board, comprising the steps of:

(a) applying to the metal surface of a metal-clad printed-circuit board a composition consisting essentially of a prepolymer selected from the group consisting of allyl acrylate, allyl chloroacrylate, allyl methacrylate, allyl crotonate, allyl cinnamate, allyl cinnamalacetate, allyl furfurylacrylate, a copolymer of allyl methacrylate with butadiene, a copolymer of allyl methacrylate with methyl methacrylate, a copolymer of allyl methacrylate with styrene, a copolymer of allyl methacrylate with vinylidene chloride, a copolymer of allyl crotonate with methyl methacrylate, a copolymer of allyl crotonate with styrene, a copolymer of allyl crotonate with vinyl chloride, a copolymer of allyl crotonate with vinyl acetate, a copolymer of allyl crotonate with vinylidene chloride, a copolymer of allyl crotonate with diethyleneglycol maleate, a copolymer of allyl cinnamate with vinylidene chloride, a copolymer of allyl cinnamate with styrene, a copolymer of allyl cinnamate with cinnamyl cinnamate, a copolymer of allyl furoate with styrene, a copolymer of allyl furoate with vinylidene chloride, diallyl oxalate, diallyl malonate, diallyl succinate, diallyl sebacate, diallyl maleate, diallyl fumerate, diallyl itaconate, diallyl tartrate, diallyl carbonate, diallyl adipate, triallyl citrate, triallyl carballylate, diallyl malate, diallyl citraconate, a copolymer of diallyl oxalate with vinylidene chloride, a copolymer of diallyl oxalate with styrene, a copolymer of diallyl malonate with vinylidene chloride, a copolymer of diallyl succinate with vinylacetate, a copolymer of diallyl succinate with vinylidene chloride, a copolymer of diallyl succinate with polyvinyl acetate, a copolymer of diallyl adipate with vinylidene chloride, a copolymer of diallyl sebacate with vinylidene chloride, a copolymer of diallyl maleate with methyl methacrylate, a copolymer of diallyl maleate with styrene, a copolymer of diallyl maleate with vinylidene chloride, and a copolymer of diallyl carbonate with methyl methacrylate, said prepolymer being capable of polymerizing to completion by photoinitiated polymerization in the presence of a sensitizing agent which is activatable by actinic radiation, said prepolymer being a solvent-soluble material which is a solid at ambient temperature, has been precipitated from the reaction mixture produced by polymerization of the allyl ester from which said prepolymer has been prepared, and undergoes very little shrinkage when further cross-lined by actinic radiation; and a photopolymerization sensitizing agent which, upon absorbing actinic radiation, can accelerate complete polymerization of said prepolymer to form a thermoset, irreversible, infusible, solid, (b) placing a mask in contact with said composition,
(c) exposing said mask to actinic radiation,
(d) removing said mask,
(e) removing the unexposed portions of said composition from said surface,
(f) etching away the exposed portions of said metal surface, and
(g) removing the remaining portion of said composition from said board.

13. A method according to claim 12 in which said prepolymer has been polymerized to partial completion until an iodine number of substantially 56 is achieved.

14. Photosensitive photographic means comprising a support having thereon a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, said allyl esters having a general formula selected from the group consisting of $C_nH_{2n-1}COOR$, $$C_nH_{2n-1-y}X_yCOOR,\ C_nH_{2n}(COOR)_2,\ C_nH_{2n-1}(COOR)_3$$
$$C_nH_{2n-y}X_y(COOR)_2,\ C_nH_{2n-1-y}X_y(COOR)_3$$
$$C_nH_{2n-2}(COOR)_2,\ C_nH_{2n-2-y}X_y(COOR)_2$$

and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizing agent which, upon absorbing actinic radiation, can accelerate complete polymerization of said ester to form thermo-set, irreversible, infusible solid.

15. Photosensitive photographic means comprising a support having thereon a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, and which has been recovered from the reaction mixture produced by the polymerization of the allyl ester from which said prepolymer has been prepared, said allyl esters having a general formula selected from the group consisting of $C_nH_{2n-1}COOR$, $C_nH_{2n-1-y}X_yCOOR$, $$C_nH_{2n}(COOR)_2,\ C_nH_{2n-1}(COOR)_3,$$
$$C_nH_{2n-y}X_y(COOR)_2,\ C_nH_{2n-1-y}X_y(COOR)_3,$$
$$C_nH_{2n-2}(COOR)_2,\ C_nH_{2n-2-y}X_y(COOR)_2$$

and ROOCOR, where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizer selected from the group consisting of acyloin ethers, tetra alkyl diamino phenylketones, bis 1-anthraquinonyl amino anthraquinones, polynuclear quinones, mononuclear quinones, vicinal ketaldonyl compounds, aryl methylenedioxy compounds, substituted β-naphthoselenazolines, substituted β-benzothiazolines, substituted β-naphthothiazolines, anthrones, benzanthrones, and azabenzanthrones; said polynuclear quinones, mononuclear quinones, substituted β-naphthoselenazolines, substituted β-benzothiazolines, substituted β-naphthothiazolines, anthrones, benzanthrones, and azabenzanthrones being free of hydroxyl, sulfo, carboxyl, and amino groups; and said aryl methylene-dioxy compounds being free of sulfo, carboxyl and amino groups and containing at least one group selected from the group consisting of aldehyde and keto groups in which the carbon atom of the group is attached to the benzene ring.

16. Photosensitive photographic means comprising a metal-clad board having thereon a composition consisting essentially of: a prepolymer selected from the group consisting of allyl acrylate, allyl chloroacrylate, allyl methacrylate, allyl crotonate, allyl cinnamate, allyl cinnamalacetate, allyl furoate, allyl furfurylacrylate, a copolymer of allyl methacrylate with butadiene, a copolymer of allyl methacrylate with methyl methacrylate, a copolymer of allyl methacrylate with styrene, a copolymer of allyl methacrylate with vinylidene chloride, a copolymer of allyl crotonate with methyl methacrylate, a copolymer of allyl crotonate with styrene, a copolymer of allyl crotonate with vinyl chloride, a copolymer of allyl crotonate with vinyl acetate, a copolymer of allyl crotonate with vinylidene chloride, a copolymer of allyl crotonate with diethyleneglycol maleate, a copolymer of allyl cinnamate with vinylidene chloride, a copolymer of allyl cinnamate with styrene, a copolymer of allyl cinnamate with cinnamyl cinnamate, a copolymer of allyl furoate with styrene, a copolymer of allyl furoate with vinylidene chloride, diallyl oxalate, diallyl malonate, diallyl succinate, diallyl sebacate, diallyl maleate, diallyl fumerate, diallyl itaconate, diallyl tartrate, diallyl carbonate, diallyl adipate, triallyl citrate, triallyl carballylate, diallyl malate, diallyl citraconate, a copolymer of diallyl oxalate with vinylidene chloride, a copolymer of diallyl oxalate with styrene, a copolymer of diallyl malonate with vinylidene chloride, a copolymer of diallyl succinate with vinylacetate, a copolymer of diallyl succinate with vinylidene chloride, a copolymer of diallyl succinate with polyvinyl acetate, a copolymer of diallyl adipate with vinylidene chloride, a copolymer of diallyl sebacate with vinylidene chloride, a copolymer of diallyl maleate with methyl methacrylate, a copolymer of diallyl maleate with styrene, a copolymer of diallyl maleate with vinylidene chloride, and a copolymer of diallyl carbonate with methyl methacrylate; and which has been polymerized to partial completion until an iodine number of substantially 56 to 64 is achieved, said prepolymer being a solvent-soluble material which is a solid at ambient temperature and undergoes very little shrinkage when further cross-linked by actinic radiation, and which has been precipitated from the reaction mixture produced by the polymerization of the allyl ester from which said prepolymer has been prepared, and a photopolymerization sensitizing agent selected from the group consisting of methyl ether of benzoin, ethyl ether of benzoin, 4,4′ bis(dimethylamino)benzophenone, 4,4′ bis(diethylamino)benzophenone, 1,4 bis(1 - anthraquinoylamino)anthraquinone, 1,5 bis(1 - anthraquinonylamino)anthraquinone, 1,2 - benzanthraquinone, 2 - methylanthraquinone, 2,5 - dipheyl - p - quinone, benzil, piperonal, 3,4 - methylene dioxychalcone, 5,6 - methylene dioxyhydrindone - 1, piperoin, 1-methyl-2 - acetyl methylene - β - naphthoselenazoline, 3-methyl-2 - benzoyl methylene benzothiazoline, 1 - methyl - 2 - benzoyl methylene-β-naphthothiazoline, anthrone, benz-2 - ethylbenzanthrone, 7 - H - benz(de) - anthracen - 7 - one, and 2 - keto - 3 - methyl - 1, 3 - diazabenzanthrone.

17. A method of making a presensitized printing plate, comprising the steps of:

(a) applying to the metal surface of a plate to be made into a printing plate a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, said allyl esters having a general formula selected from the group consisting of $C_nH_{2n-1}COOR$, $$C_nH_{2n-1-y}X_yCOOR,\ C_nH_{2n}(COOR)_2,$$
$$C_nH_{2n-1}(COOR)_3,\ C_nH_{2n-y}X_y(COOR)_2,$$
$$C_nH_{2n-1-y}X_y(COOR)_3,\ C_nH_{2n-2}(COOR)_2,$$
$$C_nH_{2n-2-y}X_y(COOR)_2,\ \text{and ROOCOR},$$

where R is an allyl group, $n$ is any integer from 1 to 17, except where the carboxylic acid is unsaturated, in which case $n$ is any integer from 2–17, $y$ is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizing agent which, upon absorbing actinic radiation, can accelerate polymerization of said prepolymer, (b) placing a mask in cooperative relationship with respect to said composition, (c) exposing said mask to actinic radiation, (d) removing said mask, and (e) removing the unexposed portions of said composition from said surface.

18. A method of making a presensitized printing plate, comprising the steps of:

(a) applying to the metal surface of a plate to be made into a printing plate a composition consisting essentially of a prepolymer selected from the group consisting of prepolymers of allyl esters of unsaturated monobasic acids, prepolymers of copolymers of allyl esters of unsaturated monobasic acids, prepolymers of allyl esters of aliphatic carboxylic acids having two or more allyl groups, and prepolymers of copolymers of allyl esters of aliphatic carboxylic acids having two or more allyl groups, said prepolymer being a solvent-soluble material which is a solid at ambient temperature and undergoes very little shrinkage when further cross-linked by actinic radiation, and which has been recovered from the reaction mixture produced by the polymerization of the allyl ester from which said prepolymer has been prepared, said allyl esters having a general formula selected from the group consisting of $C_nH_{2n-1}COOR$, $$C_nH_{2n-1-y}X_yCOOR,\ C_nH_{2n}(COOR)_2$$
$$C_nH_{2n-1}(COOR)_3,\ C_nH_{2n-y}X_y(COOR)_2,$$
$$C_nH_{2n-1-y}X_y(COOR)_3,\ C_nH_{2n-2}(COOR)_2,$$
$$C_nH_{2n-2-y}X_y(COOR)_2,\ \text{and ROOCOR},$$

where R is an allyl group, *n* is any integer from 1 to 17, except where the carboxylic acid is unsaturated, in which case *n* is any integer from 2–17, *y* is any integer from 1 to 2, and X is any group selected from the group consisting of halogen, hydroxyl, phenyl, substituted phenyl, furfuryl, alkyl having 1 to 4 carbon atoms, and alkoxy having 1 to 4 carbon atoms; and a photopolymerization sensitizer selected from the group consisting of acyloin ethers, tetra alkyl diamino phenylketones, bis 1-anthraquinonyl amino anthraquinones, polynuclear quinones, mononuclear quinones, vicinal ketaldonyl compounds, aryl methylene-dioxy compounds, substituted β-naphthoselenazolines, substituted β-benzothiazolines, substituted β-naphthothiazolines, anthrones, benzanthrones, and azabenzanthrones; said polynuclear quinones, mononuclear quinones, substituted β-naphthoselenazolines, substituted β-benzothiazolines, substituted β-naphthothiazolines, anthrones, benzanthrones, and azabenzanthrones being free of hydroxyl, sulfo, carboxyl, and amino groups; and said aryl methylenedioxy compounds being free of sulfo, carboxyl and amino groups and containing at least one group selected from the group consisting of aldehyde and keto groups in which the carbon atom of the group is attached to the benzene ring, (b) placing a mask in cooperative relationship with respect to said composition,
(c) exposing said mask to actinic radiation,
(d) removing said mask, and
(e) removing the unexposed portions of said composition from said surface.

19. A method of making a presensitized printing plate, comprising the steps of:

(a) applying to the metal surface of a plate to be made into a printing plate a composition consisting essentially of a prepolymer selected from the group consisting of allyl acrylate, allyl chloroacrylate, allyl methacrylate, allyl crotonate, allyl cinnamate, allyl cinnamalacetate, allyl furoate, allyl furfurylacrylate, a copolymer of allyl methacrylate with butadiene, a copolymer of allyl methacrylate with methyl methacrylate, a copolymer of allyl methacrylate with styrene, a copolymer of allyl methacrylate with vinylidene chloride, a copolymer of allyl crotonate with methyl methacrylate, a copolymer of allyl crotonate with styrene, a copolymer of allyl crotonate with vinyl chloride, a copolymer of allyl crotonate with vinyl acetate, a copolymer of allyl crotonate with vinylidene chloride, a copolymer of allyl crotonate with diethyleneglycol maleate, a copolymer of allyl crotonate with diethyleneglycol maleate, a copolymer of allyl cinnamate with vinylidene chloride, a copolymer of allyl cinnamate with styrene, a copolymer of allyl cinnamate with cinnamyl cinnamate, a copolymer of allyl furoate with styrene, a copolymer of allyl furoate with vinylidene chloride, diallyl oxalate, diallyl malonate, diallyl succinate, diallyl sebacate, diallyl maleate, diallyl fumerate, diallyl itaconate, diallyl tartrate, diallyl carbonate, diallyl adipate, triallyl citrate, triallyl carballylate, diallyl malate, diallyl citraconate, a copolymer of diallyl oxalate with vinylidene chloride, a copolymer of diallyl oxalate with styrene, a copolymer of diallyl malonate with vinylidene chloride, a copolymer of diallyl succinate with vinylacetate, a copolymer of diallyl succinate with vinylidene chloride, a copolymer of diallyl succinate with polyvinyl acetate, a copolymer of diallyl adipate with vinylidene chloride, a copolymer of diallyl sebacate with vinylidene chloride, a copolymer of diallyl maleate with methyl methacrylate, a copolymer of diallyl maleate with styrene, a copolymer of diallyl maleate with vinylidene chloride, and a copolymer of diallyl carbonate with methyl methacrylate, said prepolymer being capable of polymerizing to completion by photoinitiated polymerization in the presence of a sensitizing agent which is activatable by actinic radiation, said prepolymer being a solvent-soluble material which is a solid at ambient temperature, has been precipitated from the reaction mixture produced by polymerization of the allyl ester from which said prepolymer has been prepared, and undergoes very little shrinkage when further cross-lined by actinic radiation, and a photopolymerization sensitizing agent selected from the group consisting of methyl ether of benzoin, ethyl ether of benzoin, 4,4′ bis(dimethylamino)benzophenone, 4,4′ bis(diethylamino)benzophenone, 1,4 bis(1 - anthraquinoylamino)anthraquinone, 1,5 bis(1 - anthraquinoylamino)anthraquinone, 1,2 - benzanthraquinone, 2 - methyl - anthraquinone, 2,5 - diphenyl - p - quinone, benzil, piperonal, 3,4 - methylene dioxychalcone, 5,6 - methylene dioxyhydrindone - 1, piperoin, 1 - methyl - 2 - acetyl methylene - β - naphthoselenazoline, 3 - methyl - 2 - benzoyl methylene benzothiazoline, 1 - methyl - 2 - benzoyl methylene - β - naphthothiazoline, anthrone, benz - 2 - ethylbenzanthrone, 7 - H - benz(de) - anthracen - 7 - one, and 2 - keto - 3 - methyl - 1, 3 - diazabenzanthrone, (b) placing a mask in cooperative relationship with respect to said composition,
(c) exposing said mask to actinic radiation,
(d) removing said mask, and
(e) removing the unexposed portions of said composition from said surface.

References Cited

UNITED STATES PATENTS

| | | | |
|---|---|---|---|
| 2,758,074 | 8/1956 | Black et al. | 204—15 |
| 2,760,863 | 8/1956 | Plambeck | 96—115 X |
| 3,016,297 | 1/1962 | Mochel et al. | 96—35 |
| 3,030,341 | 4/1962 | Willard | 260—78.4 |
| 3,036,915 | 5/1962 | Notley | 96—84 |

FOREIGN PATENTS 555,186 4/1958 Canada.

OTHER REFERENCES

Nicholas, F. S. and Flowers, R. G., "Ind. and Eng. Chem.," vol. 42, 1950, pp. 292–295.

NORMAN G. TORCHIN, *Primary Examiner.*

R. H. SMITH, *Assistant Examiner.*